United States Patent
Fu

(10) Patent No.: US 9,470,973 B2
(45) Date of Patent: Oct. 18, 2016

(54) DESIGNING AND MANUFACTURING METHODS OF TFT LCD ARRAY POSITIONING MARK

(71) Applicant: Shenzhen China Star Optoelectronics Technology Co., Ltd., Shenzhen, Guangdong (CN)

(72) Inventor: Yanfeng Fu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 36 days.

(21) Appl. No.: 14/368,295

(22) PCT Filed: Apr. 22, 2014

(86) PCT No.: PCT/CN2014/075995
§ 371 (c)(1),
(2) Date: Jun. 23, 2014

(87) PCT Pub. No.: WO2015/149401
PCT Pub. Date: Oct. 8, 2015

(65) Prior Publication Data
US 2015/0333015 A1    Nov. 19, 2015

(51) Int. Cl.
*H01L 23/544* (2006.01)
*G03F 1/42* (2012.01)
*H01L 27/12* (2006.01)

(52) U.S. Cl.
CPC .............. *G03F 1/42* (2013.01); *H01L 23/544* (2013.01); *H01L 27/1214* (2013.01); *H01L 2223/5442* (2013.01); *H01L 2223/54426* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 8,865,517 B2 * | 10/2014 | Chiang | ............... | H01L 27/1225 257/43 |
| 2004/0057621 A1 * | 3/2004 | Lee | ............... | G06K 9/6203 382/215 |
| 2008/0204625 A1 * | 8/2008 | Lee | ............... | G02F 1/13452 349/58 |
| 2011/0180877 A1 * | 7/2011 | Koketsu | ............... | H01L 23/544 257/368 |

FOREIGN PATENT DOCUMENTS

CN    103199084 A    7/2013

* cited by examiner

*Primary Examiner* — Mohsen Ahmadi
*Assistant Examiner* — Ismail Muse
(74) *Attorney, Agent, or Firm* — Andrew C. Cheng

(57) ABSTRACT

The present invention relates to TFT LCD array positioning mark designing and manufacturing methods. The TFT LCD array positioning mark manufacturing method includes: (1) forming a passivation layer of TFT LCD array; (2) providing a mask corresponding to the passivation layer, the mask comprising a passivation layer positioning mark that corresponds to a metal positioning mark of the TFT LCD array; and (3) using the mask to form a corresponding passivation layer positioning mark on the passivation layer. The TFT LCD array positioning mark designing method includes: forming a passivation layer positioning mark on a passivation layer of an TFT LCD array to correspond to a metal positioning mark of the TFT LCD array. The present invention provides TFT LCD array positioning mark designing and manufacturing method, wherein a passivation layer positioning mark that is designed and manufactured with them shows a pattern that is more stable and is not susceptible to deformation so as to eliminate the problem of positioning failure of the metal positioning mark occurring in the cell and module processes.

7 Claims, 4 Drawing Sheets

DESIGNING AND MANUFACTURING METHODS OF TFT LCD ARRAY POSITIONING MARK

BACKGROUND OF THE INVENTION

1. Field of the Invention

The present invention relates to the field of liquid crystal display, and in particular to designing and manufacturing methods of TFT LCD (Thin-Film Transistor Liquid Crystal Display) array positioning mark.

2. The Related Arts

A TFT (Thin-Film Transistor) LCD is a thin-film field-effect transistor LCD, which is one of active matrix liquid crystal displays (AM-LCDs). A liquid crystal display, particularly a TFT-LCD, is the only display device that completely matches and gets beyond CRT (Cathode Ray Tube) displays for general performances, including brightness, contrast, power consumption, lifespan, volume, and weight and shows excellent performances, good mass productivity, high automatization, low raw material cost, and wide space of development, and will be soon a main-stream product of new eras and a sparking spot of worldwide economic growth of the 21st century. The liquid crystal displays are mostly backlighting liquid crystal displays that are generally composed of a liquid crystal display panel and a backlight module. A general liquid crystal display panel comprises a color filter (CF) substrate and a thin-film transistor (TFT) array substrate. The CF substrate comprises a plurality of color filters and a common electrode. The TFT array substrate comprises a plurality of parallel scan lines, a plurality of parallel data lines, a plurality of thin-film transistors, and a pixel electrode.

An essential manufacturing process of a typical LCD module comprises three processes, namely an array process, a cell process, and a module process. Among these processes, the array process generally involves techniques of film coating, exposure, development, and etching for forming TFTs on a glass substrate; the cell process generally involves cutting and breaking of liquid crystal and filling of liquid crystal; and the module process generally involves adding driving chips, printed wiring boards, and backlight modules to the cutting-completed panels.

In the field of semiconductor technology, photolithography is one of the indispensable steps of the manufacturing process. As is well known in the industry, the photolithographic process generally involves the following steps: coating a photoresist on a substrate and subjecting the photoresist to exposure with a mask in order to define a circuit pattern corresponding to an electronic product in order to subject the substrate under the photoresist to a subsequent etching process to form the desired circuit pattern. Certainly, completion of the manufacture of an electronic product requires several times of repeating the above steps. Taking the TFT LCD as an example for illustration, multiple rounds of masking operation must be applied to carry out photolithography in order to form a stacked structure. For the common designs of TFT LCD array, five masking operations are used to carry out photolithography for respectively forming circuit patterns of five different layers including a gate electrode (GE) layer, a semiconductor (SE) layer, a source drain (SD) layer, a contact hole (CH) layer, a pixel electrode (PE) layer.

As is well known in the industry, before the exposure process is carried out, the masks must be accurately aligned with the substrate in order to have the circuit pattern accurately projected onto the substrate. A positioning mark is generally used to achieve the alignment between the masks and the substrate. Generally, the mask associated with the gate electrode layer (the first layer) contains, in addition to a circuit pattern associated with the electronic product, a positioning mark that has been defined in advance, so that in performing the exposure operation of the gate electrode layer, the positioning mark will be simultaneously formed on the substrate through the mask of the gate electrode layer. The multiple subsequent masks (such as the masks corresponding to the semiconductor layer, the source drain layer, the contact hole layer, and the pixel electrode layer) are also provided with pre-defined positioning marks, so that before the exposure operations of the semiconductor layer, the source drain layer, the contact hole layer, and the pixel electrode layers are carried out, the positioning marks provided on the masks are used to align with the positioning mark that was previously formed on the substrate in order to ensure the accuracy of exposure operations.

The positioning marks used in the known techniques are mostly completed with gate electrode metal of the first layer. However, the first layer metal positioning mark will then be subjected to the high temperature array and cell processes so that the pattern of the metal positioning mark may readily undergo deformation and shifting and consequently, positioning failure may readily occur in the cell and module processes. Taking the conventional TFT LCD array design that adopts five rounds of masking operation as an example, a positioning mark is generally designed on a periphery of an array substrate for subsequent use with the array and cell processes. Most of the positioning marks are formed with the gate or SD metal (but most positioning marks are still formed by using the gate metal of the first layer). On the other hand, there is generally a gate insulation layer formed on the gate electrode layer; an etch stop (ES) layer serving as a protection layer is generally formed on the semiconductor layer; a passivation (PV) layer serving as a protection layer is generally formed on the SD layer, these gate insulation layer, etch stop layer, and passivation layer being generally formed of silicon nitrides. For the conventional TFT LCD array design that adopts five rounds of masking operation, a second layer of silicon nitride layer and a fourth layer of silicon nitride protection layer are formed on the metal-made positioning marks and during the film formations of the second and fourth silicon nitride layers, the metal-made positioning mark is readily susceptible to the influences caused by the high temperature of the formation of the films and the stresses of the silicon nitride films, resulting in deformation of the positioning mark that may lead to positioning failure in the subsequent processes. The machines of the array process have improved accuracy and the extent of deformation of the positioning mark is less significant when passing through only the array process. However, once additionally subjected to the high temperature cell process, together with the fact that the machines of the cell process are generally of less accuracy than those of the array process, the metal positioning mark commonly undergoes deformation, shifting, and incorrect positioning of the metal positioning mark during the cell and module processes. Thus, further improvement is necessary.

SUMMARY OF THE INVENTION

Thus, an object of the present invention is to provide a designing method of a TFT LCD array positioning mark that overcomes the problem of positioning failure of a metal positioning mark during cell and module processes.

Another object of the present invention is to provide a manufacturing method of a TFT LCD array positioning mark that overcomes the problem of positioning failure of a metal positioning mark during cell and module processes.

To achieve the above objects, the present invention provides a TFT LCD (Thin-Film Transistor Liquid Crystal Display) array positioning mark designing method, which comprises forming a passivation layer positioning mark on a passivation layer of an TFT LCD array to correspond to a metal positioning mark of the TFT LCD array.

Wherein, the passivation layer comprises a silicon nitride layer.

Wherein, the passivation layer positioning mark is of a cruciform shape.

Wherein, the metal positioning mark is of a rectangular shape.

Wherein, the metal positioning mark comprises a metal positioning mark on a gate layer.

Wherein, the metal positioning mark comprises a metal positioning mark on a drain source layer.

Wherein, the passivation layer positioning mark comprises a hollow pattern.

Wherein, the passivation layer positioning mark comprises a solid pattern.

The present invention also provides a TTFT LCD (Thin-Film Transistor Liquid Crystal Display) array positioning mark manufacturing method, comprising:

(1) forming a passivation layer of TFT LCD array;

(2) providing a mask corresponding to the passivation layer, the mask comprising a passivation layer positioning mark that corresponds to a metal positioning mark of the TFT LCD array; and (3) using the mask to form a corresponding passivation layer positioning mark on the passivation layer.

Wherein, the passivation layer comprises a silicon nitride layer.

The present invention further provides a TFT LCD (Thin-Film Transistor Liquid Crystal Display) array positioning mark designing method, which comprises forming a passivation layer positioning mark on a passivation layer of an TFT LCD array to correspond to a metal positioning mark of the TFT LCD array;

wherein the passivation layer comprises a silicon nitride layer;

wherein the passivation layer positioning mark is of a cruciform shape; and wherein the metal positioning mark is of a rectangular shape.

The metal positioning mark comprises a metal positioning mark on a gate layer.

The metal positioning mark comprises a metal positioning mark on a drain source layer.

The passivation layer positioning mark comprises a hollow pattern.

The passivation layer positioning mark comprises a solid pattern.

In summary, the present invention provides TFT LCD array positioning mark designing and manufacturing method, wherein a passivation layer positioning mark that is designed and manufactured with them shows a pattern that is more stable and is not susceptible to deformation so as to eliminate the problem of positioning failure of the metal positioning mark occurring in the cell and module processes.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

Figure 1:
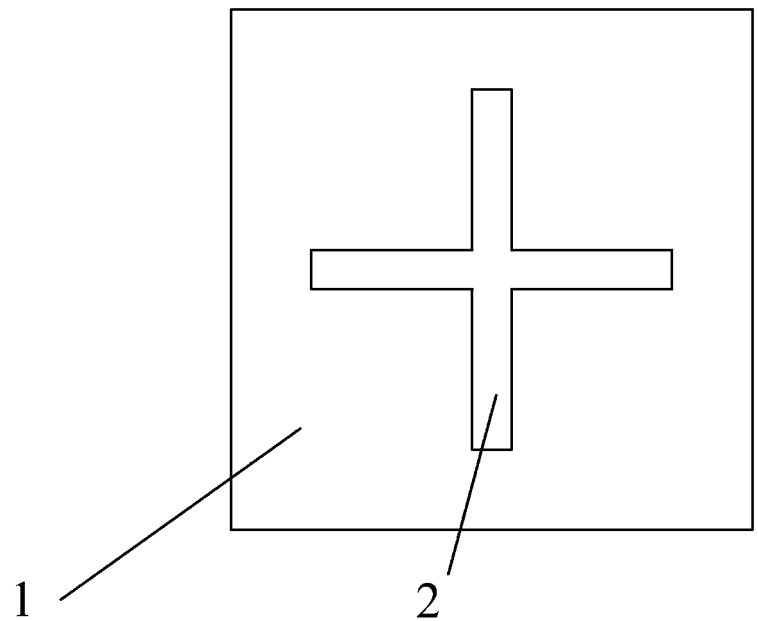
FIG. 1 is a schematic view showing a design of a positioning mark for fourth round masking according to a preferred embodiment of a TFT LCD array positioning mark designing method of the present invention.
Figure 2:
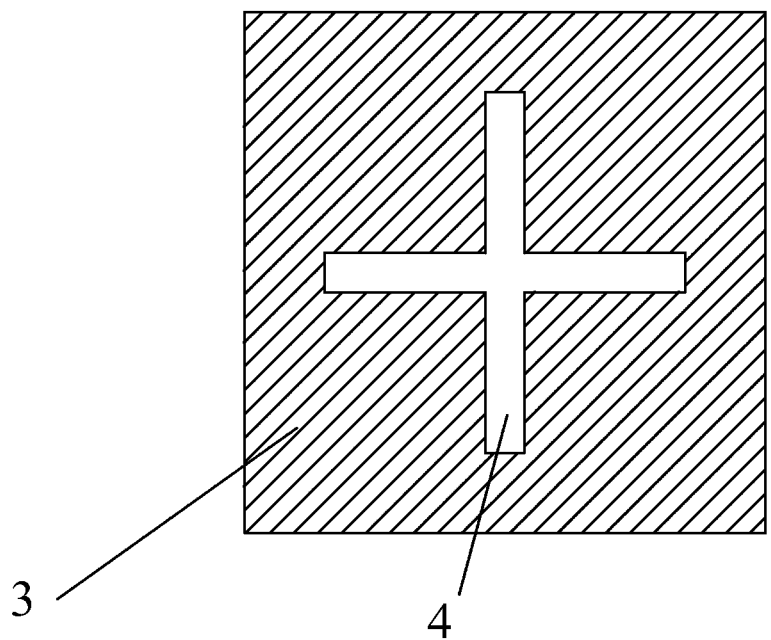
FIG. 2 is a schematic view showing a passivation layer positioning mask that is formed through dry etching after application of the masking of FIG. 1.
Figure 3:
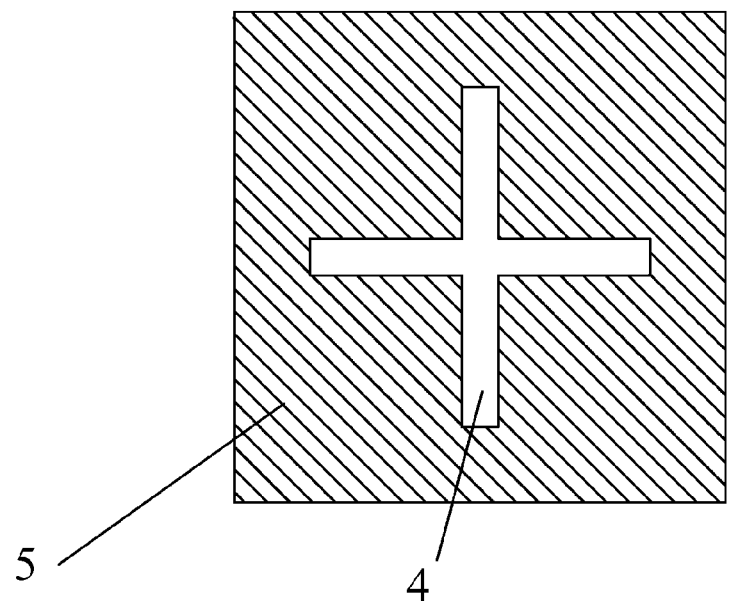
FIG. 3 is a schematic view showing the passivation layer positioning mark of FIG. 2 after peeling of photoresist.
Figure 4:
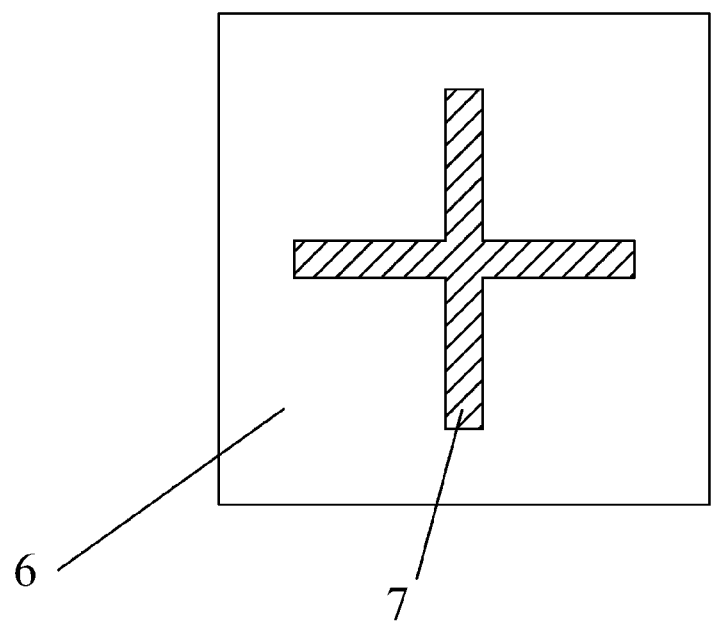
FIG. 4 is a schematic view showing a metal positioning mark according to the preferred embodiment of the TFT LCD array positioning mark designing method of the present invention.

The present invention provides TFT LCD array positioning mark designing and manufacturing methods, which are applicable to various types of conventional TFT LCD array design that comprises passivation layers and involves multiple rounds of masking operations. FIGS. 1-4 provides an example for illustration of the TFT LCD array positioning mark designing method according to the present invention by means of a TFT LCD array design involving five rounds of masking operation. FIG. 1 is a schematic view showing a design of a positioning mark for fourth-round masking according to a preferred embodiment of the TFT LCD array positioning mark designing method of the present invention; FIG. 2 is a schematic view showing a passivation layer positioning mask that is formed through dry etching after application of the masking of FIG. 1; FIG. 3 is a schematic view showing the passivation layer positioning mark of FIG. 2 after peeling of photoresist; and FIG. 4 is a schematic view showing a metal positioning mark according to the preferred embodiment of the TFT LCD array positioning mark designing method of the present invention.

The five round masking TFT LCD array design that is given as an example herein generally comprises:

providing a substrate;

forming a gate on the substrate through sputtering and a first-round masking operation;

forming a gate insulation layer on the gate through chemical vapor deposition;

forming an oxide semiconductor layer on the gate insulation layer through sputtering and a second-round masking operation;

forming a first protection layer (an etch stop layer) on the oxide semiconductor layer through chemical vapor deposition, forming a metal layer on the first protection layer through a sputtering operation, and forming a data line electrode through a third-round masking operation;

forming a second protection layer (a passivation layer) on the first protection layer and the data line electrode through chemical vapor deposition and forming first, second, and third bridging holes through a fourth-round masking operation, the first bridging hole being formed in the data line electrode, the second and third bridging holes being formed in two ends of the oxide semiconductor layer; and forming a transparent conductive layer on the second protection layer through sputtering, patternizing the transparent conductive layer through a fifth-round masking operation, wherein the transparent conductive layer has a portion electrically connecting the data line electrode and the oxide semiconductor layer through the first and second bridging holes and another portion electrically connected to the oxide semiconductor layer through the third bridging holes to form a pixel electrode.

In the instant embodiment, the gate insulation layer, the first protection layer, and the second protection layer are made of materials of silicon nitrides and as options, other materials of similar applications can also be used.

Referring to FIG. 1, to form a TFT LCD array passivation layer positioning mark aligning with a TFT LCD array metal positioning mark, a positioning mark pattern 2 is provided on a fourth-round mask 1. The fourth-round mask 1 shown in FIG. 1 is only a portion of a complete mask. The positioning mark pattern 2 can be selectively provided on a non-display zone of the fourth-round mask 1, preferably on a long edge, and be coincident with a positioning mark pattern on a first-round mask, so that a positioning mark that is not covered by photoresist can be formed after the fourth-round photolithography.

Referring to FIG. 2, to carry out a photolithographic process with the fourth-round mask 1 shown in FIG. 1, a silicon nitride layer that is formed without being covered by photoresist and corresponds to the positioning mark pattern 2 is subjected to dry etching, where the silicon nitride layer is formed in a previous film forming operation (for example through chemical vapor deposition), thereby forming a passivation layer positioning mark 4, hatching indicating an array zone 3 being stacked with PEP2&4 SiNx and PEP4 photolithographic photoresist, where PEP stands for photo-etching-process and PEP2 and PEP4 are respectively the second-round photolithographic and etching process and the fourth-round photolithographic and etching process. In the instant embodiment, the gate insulation layer and the passivation layer that are formed in the second-round photolithographic and etching process and the fourth-round photolithographic and etching process are involved with silicon nitride layers. The photolithographic photoresist is applied in the fourth-round photolithographic and etching process. The passivation layer positioning mark 4, which is of a cruciform shape, is formed with dry etching of SiNx, where although the etched depth thereof may exceed the range of the passivation layer, it is formed being first etching the passivation layer and is thus referred to as the passivation layer positioning mark in the present invention.

The positioning mark pattern that is not covered with photoresist is formed after the fourth-round photolithography so that the problem of deformation of array gate metal positioning mark during the alignment of machines of cell and module processes can be alleviated. The silicon nitride is subjected to dry etching to be hollowed for forming the positioning mark pattern. The passivation layer is made of a material that is resistant to high temperature, such as silicon nitrides, so that the positioning mark pattern that is formed by hollowing the silicon nitride is more stable and is not susceptible to deformation.

Referring to FIG. 3, the array zone 3 of FIG. 2 is then subjected to peeling of photoresist to form a photoresist free array zone 5, where hatching indicates the array zone 3 is stacked with PEP2&4 SiNx. The cruciform passivation layer positioning mark 4 that is free of silicon nitride is formed after dry etching of SiNx.

Referring to FIG. 4, compared with the passivation layer positioning mark 4 of FIG. 3, in FIG. 4, hatching is used to indicate a cruciform metal positioning mark 7 that is a positioning mark formed with a regular gate metal and the array zone 6 is the substrate.

Figure 5:
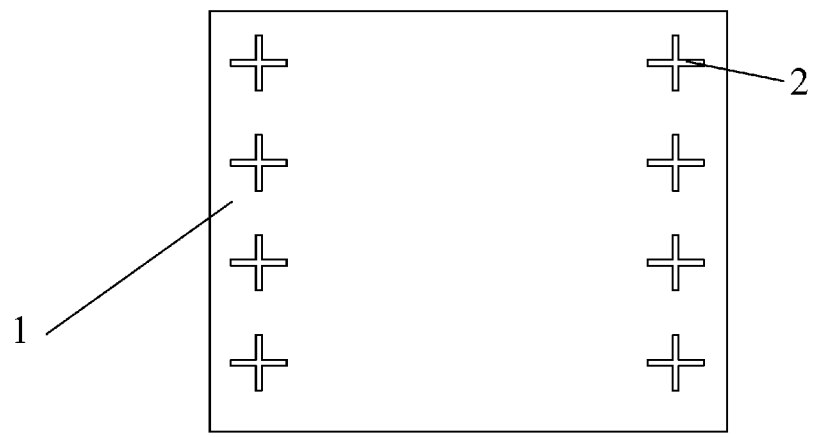
FIG. 5 is a schematic view showing a mask according to a preferred embodiment of the TFT LCD array positioning mark designing method of the present invention.

Referring to FIG. 5, a schematic view is given to show a mask according to a preferred embodiment of the TFT LCD array positioning mark designing method of the present invention. Referring collectively to the description related to FIG. 1, the fourth-round mask 1 is a mask that corresponds to a passivation layer and the positioning mark patterns 2 are set on a periphery of the fourth-round mask 1 but not in a display zone.

Figure 6:
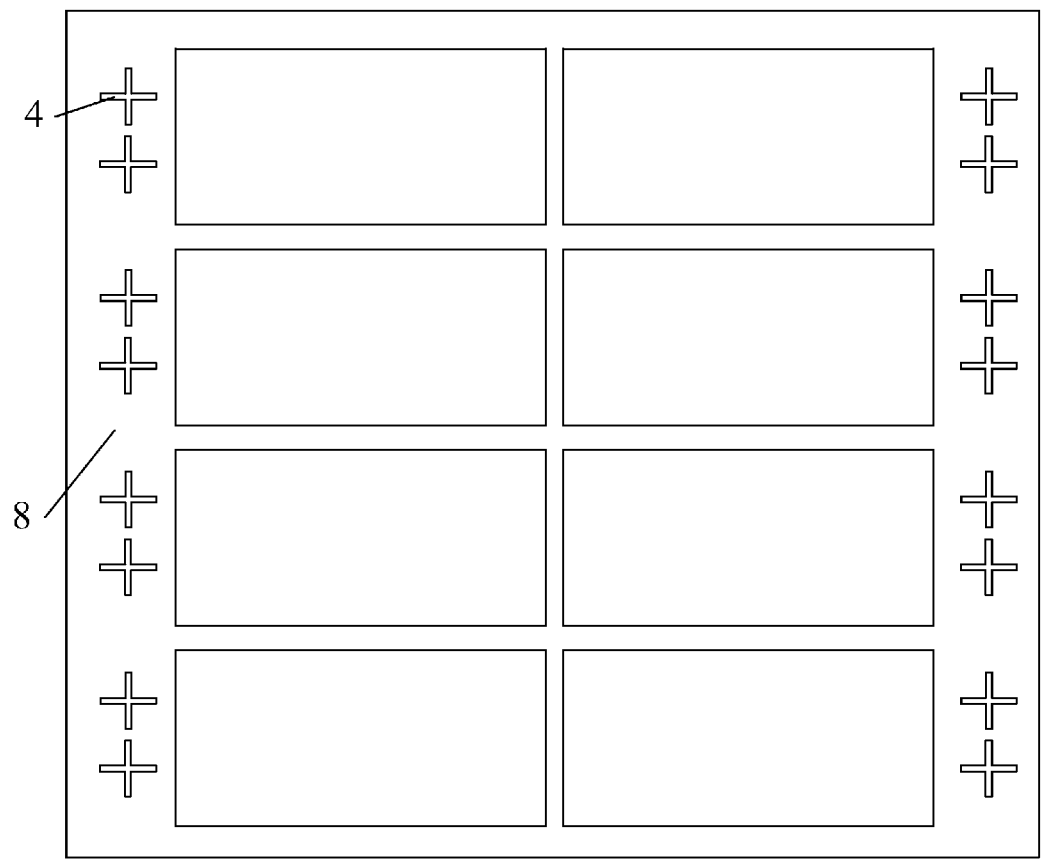
FIG. 6 is a schematic view showing the positions of the passivation layer positioning marks on a large panel according to the preferred embodiment of the TFT LCD array positioning mark designing method of the present invention.

Referring to FIG. 6, which is a schematic view showing the positions of the passivation layer positioning marks on a large panel according to the preferred embodiment of the TFT LCD array positioning mark designing method of the present invention, the locations of the passivation layer positioning marks 4 on a large panel 8 are illustrated. The passivation layer positioning marks 4 of the large panel 8 are resistant to high temperatures of the subsequent cell and module processes without being susceptible to deformation, making them suitable for alignment of the machines of the cell and module processes.

Figure 7:
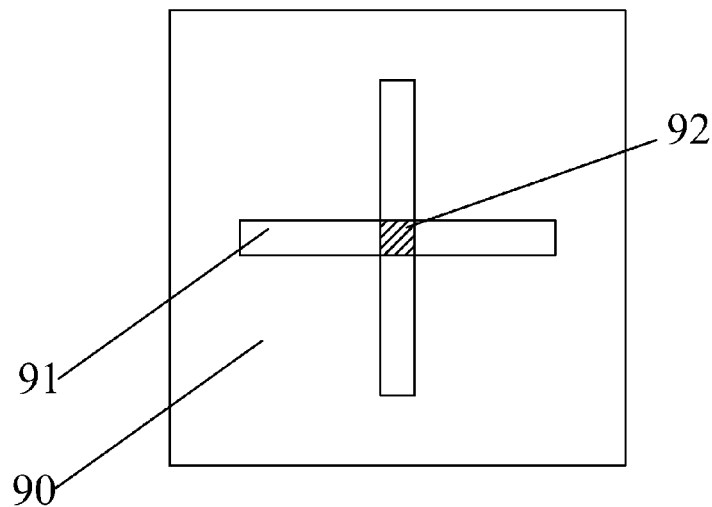
FIG. 7 is a schematic view showing a passivation layer positioning mark and a metal positioning mark according to another preferred embodiment of the TFT LCD array positioning mark designing method of the present invention.

Referring to FIG. 7, a schematic view is given to show a passivation layer positioning mark and a metal positioning mark according to another preferred embodiment of the TFT LCD array positioning mark designing method of the present invention. The array zone 90 comprises, at a center thereof, a hatched block that is used to indicate a metal positioning mark 92. In other words, a positioning mark pattern that is formed on the gate mask, namely the first-round mask, is rectangular. The cruciform mark is a passivation layer positioning mark 91. In other words, the positioning mark pattern formed on the passivation layer mask, namely the fourth-round mask, is cruciform. The efficacy is making the alignment in the cell and module processes more convenient, for a single cruciform positioning mark may sometime fail. Further, the solid metal cruciform positioning mark of the gate mask may also fails for alignments during the cell and module processes and this is because there is a great amount of peripheral wiring that is set around the cruciform positioning mark and is also made of metal so as to lead to erroneous recognition by the machines of the cell and module processes and thus resulting in failures. The cruciform positioning marks of the passivation layer according to the present invention is formed by hollowing silicon nitride, which shows a color different from the great amount of peripheral wiring so as to reduce the chance of erroneous recognition.

Figure 8:
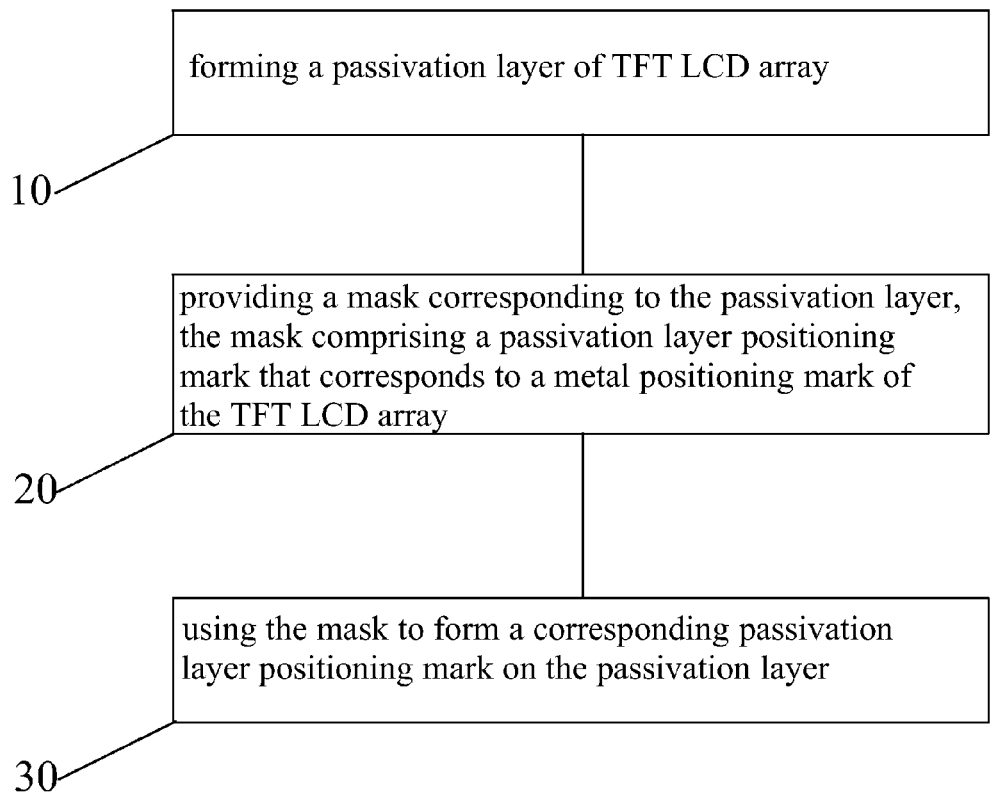
FIG. 8 is a flow chart illustrating a preferred embodiment of a TFT LCD array positioning mark manufacturing method according to the present invention.

Referring to FIG. 8, which is a flow chart illustrating a preferred embodiment of a TFT LCD array positioning mark manufacturing method according to the present invention, the TFT LCD array positioning mark manufacturing method is applicable to various types of conventional TFT LCD array design that comprises passivation layers and involves multiple rounds of masking operations and comprises:

Step 10: forming a passivation layer on the TFT LCD array;

Step 20: providing a mask corresponding to the passivation layer, the mask comprising a passivation layer positioning mark that corresponds to a metal positioning mark of the TFT LCD array; and Step 30: using the mask to form a corresponding passivation layer positioning mark on the passivation layer.

In the process, the passivation layer is a silicon nitride layer.

Taking a TFT LCD array design involved five round masking as an example, according to the positioning mark manufacturing method of the present invention, the fourth-round mask is used to form a hollow pattern or alternatively a solid pattern, and a regular manufacturing operation is carried out: silicon nitride film forming, exposure (regular alignment with the first/third layer metal positioning marks and exposure), dry etching, and photoresist removal to complete the silicon nitride made positioning mark. The present invention forms the positioning mark on silicon nitride of the fourth layer so that the manufacturing operation is consistent with the conventional operations of film forming, exposure, etching, and photoresist removal, making it easy to carry out.

In summary, the present invention provides TFT LCD array positioning mark designing and manufacturing method, wherein a passivation layer positioning mark that is designed and manufactured with them shows a pattern that is more stable and is not susceptible to deformation so as to eliminate the problem of positioning failure of the metal positioning mark occurring in the cell and module processes.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method, comprising the following steps:
   (1) providing a substrate;
   (2) forming a gate on the substrate through sputtering a metal layer and patterning the metal layer with a first-round masking operation by using a first mask;
   (3) forming a gate insulation layer on the gate through chemical vapor deposition;
   (4) forming an oxide semiconductor layer on the gate insulation layer through sputtering and a second-round masking operation by using a second mask;
   (5) forming a first protection layer that serves as an etch stop layer on the oxide semiconductor layer through chemical vapor deposition, forming a metal layer on the first protection layer through sputter operation, and forming a data line electrode through a third-round masking operation by using a third mask;
   (6) forming a second protection layer that serves as a passivation layer on the first protection layer and the data line electrode through chemical vapor deposition and forming first, second, and third bridging holes in the passivation layer through a fourth-round masking operation by using a fourth mask such that the first bridging hole is formed on the data line electrode and the second and third bridging holes are respectively formed on two ends of the oxide semiconductor layer; and
   (7) forming a transparent conductive layer on the second protection layer through sputtering and patterning the transparent conductive layer with a fifth-round masking operation by using a fifth mask such that a first portion of the transparent conductive layer is electrically connected to the data line electrode and one of the two ends of the oxide semiconductor layer through the first and second bridging holes and a second portion of the transparent conductive layer is electrically connected to the other one of the two ends of the oxide semiconductor layer through the third bridging hole for formation of a pixel electrode;
   wherein the first mask comprises a pattern that forms the gate and a mark pattern that forms a metal positioning mark on the metal layer; and
   wherein the fourth mask comprises a pattern that forms the first, second, and third bridging holes in the passivation layer and the fourth mask also comprises a mark pattern that is formed in a predetermined location of the fourth mask for forming a passivation layer positioning mark in the passivation layer during the fourth-round masking operation such that the passivation layer positioning mark corresponds in position to the metal positioning mark formed on the metal layer with which the gate is formed.

2. The method as claimed in claim 1, wherein the passivation layer comprises a silicon nitride layer.

3. The T method as claimed in claim 1, wherein the passivation layer positioning mark is of a cruciform shape.

4. The method as claimed in claim 3, wherein the metal positioning mark is of a rectangular shape.

5. The method as claimed in claim 1, wherein the passivation layer positioning mark comprises a hollow pattern.

6. The method as claimed in claim 1, wherein the passivation layer positioning mark comprises a solid pattern.

7. The method as claimed in claim 1 further comprising a step of conducting a cell process and a module process in which additional masks are used, wherein alignment of the additional masks is achieved with the passivation layer positioning mark.

* * * * *